(12) United States Patent
Tuckerman et al.

(10) Patent No.: US 7,485,956 B2
(45) Date of Patent: Feb. 3, 2009

(54) MICROELECTRONIC PACKAGE OPTIONALLY HAVING DIFFERING COVER AND DEVICE THERMAL EXPANSIVITIES

(75) Inventors: David B. Tuckerman, Orinda, CA (US); Giles Humpston, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 515 days.

(21) Appl. No.: 11/204,680

(22) Filed: Aug. 16, 2005

(65) Prior Publication Data

US 2007/0042527 A1    Feb. 22, 2007

(51) Int. Cl.
*H01L 23/12* (2006.01)

(52) U.S. Cl. .............. 257/704; 257/E23.193; 257/E23.083; 438/106

(58) Field of Classification Search .......... 257/704, 257/E23.193
See application file for complete search history.

(56) References Cited

U.S. PATENT DOCUMENTS

| | | | |
|---|---|---|---|
| 5,072,520 A | 12/1991 | Nelson | |
| 5,610,431 A | 3/1997 | Martin | |
| 5,895,233 A | 4/1999 | Higashi et al. | |
| 6,326,697 B1 | 12/2001 | Farnworth | |
| 6,429,511 B2 | 8/2002 | Ruby et al. | |
| 2005/0067178 A1* | 3/2005 | Pearson et al. | 174/52.4 |
| 2005/0095835 A1 | 5/2005 | Humpston et al. | |
| 2006/0216856 A1* | 9/2006 | Zhao | 438/106 |

OTHER PUBLICATIONS

U.S. Appl. No. 10/949,847, Office Action dated Jun. 30, 2006.
U.S. Appl. No. 10/949,847, Amendment dated Sep. 20, 2006.
U.S. Appl. No. 10/949,847, Notice of Allowance dated Mar. 8, 2007.

* cited by examiner

*Primary Examiner*—Tu-Tu V Ho
(74) *Attorney, Agent, or Firm*—Lerner, David, Littenberg, Krumholz & Mentlik, LLP

(57) ABSTRACT

A microelectronic package is provided that includes a microelectronic device and a cover. The device and the cover are typically substantially immobilized relative to each other. The cover typically has a higher coefficient of thermal expansion while the device has a higher effective stiffness. The package may be formed in wafer-level processes.

32 Claims, 9 Drawing Sheets

MICROELECTRONIC PACKAGE OPTIONALLY HAVING DIFFERING COVER AND DEVICE THERMAL EXPANSIVITIES

FIELD OF THE INVENTION

The invention relates generally to microelectronic packages that include a microelectronic device and a cover and an optional cavity therebetween. In particular, the invention relates to packages that include devices and covers that may have differing thermal expansivities, differing effective stiffnesses, coatings and/or layers. Also provided are wafer-level microelectronic assemblies and methods for forming microelectronic packages and assemblies.

BACKGROUND OF THE INVENTION

Microelectronic devices such as semiconductor chips are flat bodies with contacts disposed on the front surface that are connected to the internal electrical circuitry of the chip itself. To facilitate ease in handling, testing and other processes associated with product manufacturing, semiconductor chips are typically provided in microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone.

Certain microelectronic device chips require a protective element, e.g., a cover over all or part of the front surface. For example, chips referred to as surface acoustic wave or "SAW" chips incorporate acoustically-active regions on their front surfaces, which must be protected from physical and chemical damage. Similarly, microelectromechanical systems or "MEMS" chips may include microscopic electromechanical devices such as microphone transducers or micromechanical devices such as sensors that require protection. See, e.g., U.S. Pat. No. 5,610,431 to Martin. In any case, the covers used for MEMS and SAW chips are generally spaced from the front surface of the chip to an open gas-filled or vacuum void beneath the cover in the active area, so that the cover does not touch the acoustical or mechanical elements.

In addition, certain electro-optical chips such as optical sensing chips and light-emitting chips have photosensitive elements which also must be protected by a cover. Voltage controlled oscillators (VCOs) and other radio frequency (RF) device sometimes also require a cover to be placed over the active area.

Miniature SAW devices can be made in the form of a wafer, and provided with electrically conductive contacts used to make electrical connections between the SAW device and other circuit elements. In addition, the devices can be provided with covers while still in wafer form. The wafer may then severed to provide individual devices. For example, as described in U.S. Pat. No. 6,429,511 a cover wafer formed from a material such as silicon can be treated to form a large number of hollow projections and then bonded to the top surface of the active material wafer, with the hollow projections facing toward the active wafer. After bonding, the cover wafer is polished to remove the material of the cover wafer close to the projections. This leaves the projections in place as covers on the active material wafer, and thus forms a composite wafer with the active region of each SAW device covered by a cover. Such a composite wafer can be severed to form individual units.

Similarly, U.S. patent application Ser. No. 10/949,674, entitled "Structure and Method of Making Capped Chips Having Vertical Interconnects," filed Sep. 24, 2004, inventors Humpston, Tuckerman, McWilliams, Haba, and Mitchell, describes wafer-level methods for producing capped chips. The capped chips have electrical interconnects made from elements that extend from contacts of a chip at least partially through a plurality of through holes of a cap. The electrical interconnects may be solid, so as to form seals extending across the through holes. In some cases, stud bumps extend from the contacts, forming parts of the electrical interconnects. In some cases, a fusible conductive medium forms a part of the electrical interconnects.

Additional wafer-level packages are described in U.S. Pat. No. 6,326,697 to Farnworth.

As alluded to above, it has been proposed that microelectronic packages be formed as a wafer-level assembly to improve productivity and reduce costs associated with microelectronic manufacturing. Wafer-level assemblies allow a plurality of devices in the form of a wafer to be packaged with one or more covers. As a result, a unitary wafer-level structure is formed. Once formed, the wafer-level structure may then be diced and separated into individual packages.

Depending on the configuration and other requirements of microelectronic packaging involving a microelectronic device and a cover, different cover materials may be used. For example, when the coefficient of thermal expansion (CTE) for the device differs significantly from the CTE for the cover, however, the device and the cover will expand and contract at different rates. As described in more detail below, problems associated with CTE mismatch between the wafer and the cover is exacerbated due to the size of the wafer-level assembly. Thus, wafer-level manufacturing of microelectronic packages typically requires exceptionally close matching of device and substrate CTE. For example, as described in U.S. patent application Ser. No. 10/949,674, when microelectronic devices made from silicon are packaged with a cover in a wafer-level manufacturing process, silicon or a glass having a CTE similar to that of silicon may be used to form covers. Similarly, as described in U.S. Pat. No. 6,429,511 to Ruby et al. a silicon cover may be provided over a silicon wafer.

Accordingly, there exist opportunities to provide alternatives and improved technologies to overcome the problems associated with microelectronic packages having a cavity located between covers and devices, particularly those technologies that lend themselves to wafer-level manufacturing of packages and those technologies that solve CTE mismatch problems between covers and devices.

SUMMARY OF THE INVENTION

In general, the invention provides a microelectronic package that includes a microelectronic device and a cover. The device has a front surface and a plurality of electrical contacts on the front surface. The cover has first and second opposing surfaces and may have a plurality of through holes each extending from an opening on the first surface to a second opening on the second surface. The cover and the device may be substantially immobilized relative to each other such that the through holes are typically aligned with the electrical contacts and that an optional cavity is located between the device and cover. In addition, the device and cover may have substantially different coefficients of thermal expansion. Furthermore, the device and cover each may have an effective stiffness selected according to the requirements of the package.

The invention is particularly suited for packages that include a cover having a higher CTE than the device, though covers having a lower CTE may benefit from the invention as well. In any case, the cover CTE may differ from the device CTE of the device by at least about 1 ppm/° C. Optimally, the difference in the coefficients of thermal expansion is at least 2 ppm/° C.

In addition, the invention is particularly suited for instances in which the effective stiffness of the cover is substantially lower that of the device. For example, the effective cover stiffness may be no greater than about 10% of the effective device stiffness. When the cover and the device are made from different classes of materials, e.g., polymeric and semiconductor materials, the effective stiffnesses of the cover and device may differ to an even greater degree. In some instances, the effective cover stiffness may be no greater than about 1% of the effective device stiffness.

The cover may be made from any of a number of materials depending on the requirements of the package. In general, the cover may include one or more polymeric, ceramic and/or metallic materials. Such materials may be single crystalline, multicrystalline, or amorphous (as in glass). Exemplary polymeric materials include fluorinated polymers and polyimides. As polymeric materials are typically highly water permeable relative to ceramic and metallic materials, a substantially water-vapor impermeable coating may be provided on covers formed from a polymeric material. Advantageously, these coating may provide additional functions such as wavelength selectivity, antireflection, antiscratch, etc.

In some embodiments, the package may include a cover layer on the first and/or second cover surface. The device, cover, and cover layer may comprise first, second, and third, materials, respectively wherein any two of the device, cover, or cover layer materials may differ from each other.

When present, the cover layer is typically thinner than the cover. In addition, the cover layer may be removable from the cover. Any of a number of cover layer materials that are solvent removable may be used. Preferred solvents typically are water based.

In some embodiments, an organic material may be provided within one or more through holes, and optionally on a cover surface as well.

The invention also provides a method for forming a microelectronic package. The method involves substantially immobilizing a microelectronic device having a front surface and a plurality of electrical contacts on the front surface relative to a cover having first and second opposing surfaces such that the second cover surface faces the front device surface. Optionally, such immobilization may result in the formation of a cavity between the cover and the device. Then, material is selectively removed from at least the cover so as to form a plurality of through holes that each extend from a first opening on the first surface to a second opening on the second surface. Optionally, laser ablation may be used to form the through holes. In any case, the through holes are typically aligned with the electrical contacts.

Irrespective of how the holes are formed, the invention allows for the simultaneous metallization of one or more through-hole sidewalls and of the device contacts.

When a cavity is present, it may contain a gas at a pressure and temperature that approximates an average external atmosphere pressure that the device is projected to experience.

BRIEF DESCRIPTION OF THE DRAWINGS

FIG. 1A depicts the package in cross-sectional view. FIG. 1B depicts the package in plan view. FIG. 1C depicts the cover of the package in cross-sectional view without the other components of the package.

FIG. 3A depicts the application of seal material so as to form a picture frame seal that covers contact. FIG. 3B depicts that application of an etchant through through-holes in the cover to remove selective portions of the picture frame seal material. FIG. 3C depicts the removal of sufficient amount of seal material to expose the device contacts for attachment to interconnect structures.

FIG. 8A depicts the mmetallization of all upward facing external surfaces of the package. FIG. 8B depicts the removal of the sacrificial layer.

In FIG. 10A, the cover is attached to the device in a manner such that a seal material covers the contacts. In FIG. 10B, a sacrificial layer applied to the upper surface of the cover, thereby filling the through-holes of the cover. FIG. 10C depicts the removal of the sacrificial layer and laser drilling or etching of the package to form through-holes that provides access to the contacts.

FIG. 11A depicts in cross-sectional view the assembly at a temperature that allows for cover and wafer feature alignment. FIG. 11B depicts in cross-sectional view the assembly at a different temperature that does not allow for cover and wafer feature alignment.

DETAILED DESCRIPTION

Before describing the present invention in detail, it is to be understood that the invention is not limited to specific microelectronic devices or types of electronic products, as such may vary. It is also to be understood that the terminology used herein is for the purpose of describing particular embodiments only, and is not intended to be limiting.

As used in this specification and the appended claims, the singular article forms "a," "an," and "the" include both singular and plural referents unless the context clearly dictates otherwise. Thus, for example, reference to "a cavity," includes a plurality of cavities as well as a single conductive region, reference to "a microelectronic device" includes a single device as well as a combination of devices, and the like.

In addition, terminology indicative or suggestive of a particular spatial relationship between elements of the invention is to be construed in a relative sense rather an absolute sense unless the context of usage clearly dictates to the contrary. For example, the term "over" as used to describe the spatial orientation of a cover relative to a device does not necessarily indicate that the cover is located above the device. Thus, in a package that includes a cover placed over a device, the cover may be located above, at the same level as, or below the device depending on the package's orientation. Similarly, an "upper" surface of a cover may lie above, at the same level as, or below other portions of the cover depending on the orientation of the cover.

Thus, in a first aspect, the invention pertains to a microelectronic package that includes a microelectronic device and a cover having substantially different coefficients of thermal expansion. The device may have an effective stiffness that is substantially higher than that of the cover. Typically, the cover and the device are substantially immobilized relative to each other.

It should be noted that the term "substantially" as used to describe the term "immobilized," refers to the degree to which a plurality of items' movement is restricted relative to each other so as to allow for the proper functioning of the invention. For example, when a package is constructed such that it functions properly even when cover and device are moved relative to each other by a distance as a result of the difference between the cover and device CTE, the cover and device are considered "substantially immobilized" relative to each other when movement therebetween is restricted to that distance. Similarly, the terms "substantial" and "substantially" are used analogously in other contexts involve an analogous definition.

Figure 1A:
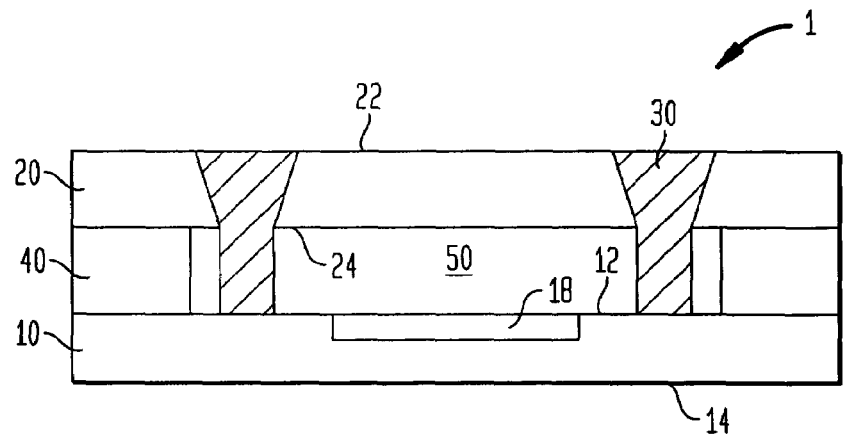
FIGS. 1A-1C, collectively referred to as FIG. 1, schematically illustrate a wafer-level package having interconnect structures and a picture frame seal that lies completely outside of the interconnect structures.
Figure 1B:
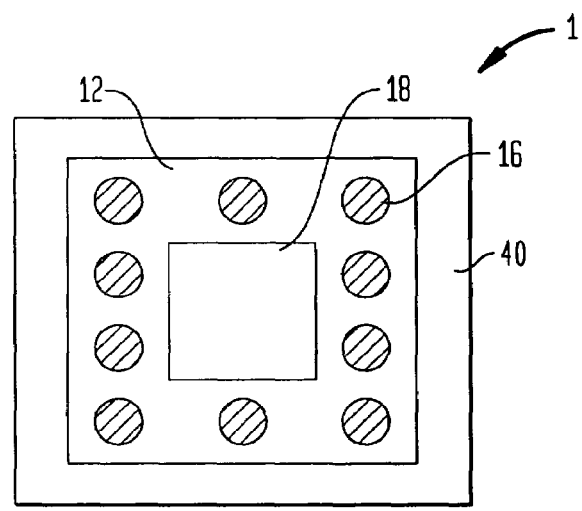
Figure 1C:
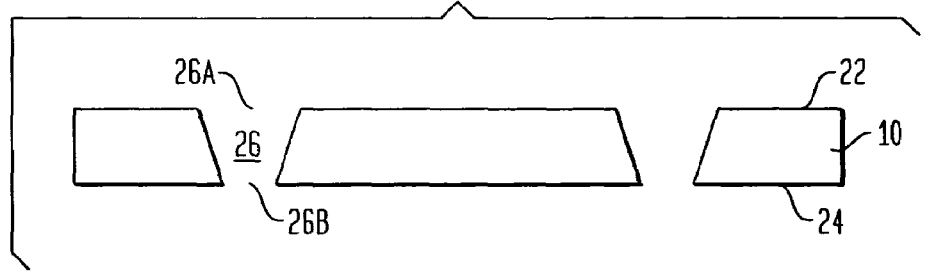

In general, the invention may be used to supplement known technologies and to overcome the disadvantages associated therewith. To illustrate the advantages of the invention, FIG. 1 is provided as an example of a wafer-level cavity package which can be adapted to incorporate the invention in part or in whole. As with all figures referenced herein, in which like parts are referenced by like numerals, FIG. 1 is not necessarily to scale, and certain dimensions may be exaggerated for clarity of presentation. As shown, package 1 includes a microelectronic device 10. The microelectronic device 10 is generally depicted as having opposing front and rear major surfaces indicated at 12 and 14, respectively. The front and rear surfaces are depicted as substantially planar and parallel to each other. The front surface 12 of the microelectronic device 10 includes a plurality of electrical contacts 16 surrounding an active front region 18.

A cover 20 in the form of a lid having first and second opposing surfaces indicated at 22 and 24, respectively. A plurality of through holes 26 each extends through the lid from a first opening 26A on the first surface 22 to a second opening 26B on the second surface 24. The second cover surface 24 is positioned to face the front device surface 10 such that the through holes 26 are aligned with the electrical contacts 16. A electrically conductive interconnect structure 30 extends from each electrical contact 16 through the through hole 26 aligned therewith. Picture frame seal 40 circumscribes the interconnect structures and immobilizes the cover 20 and device 10 relative to each other such that cover surface 24 is parallel to device surface 12. As a result, cavity 50 is defined by cover surface 24, device surface 12, and seal 40.

Figure 2A:
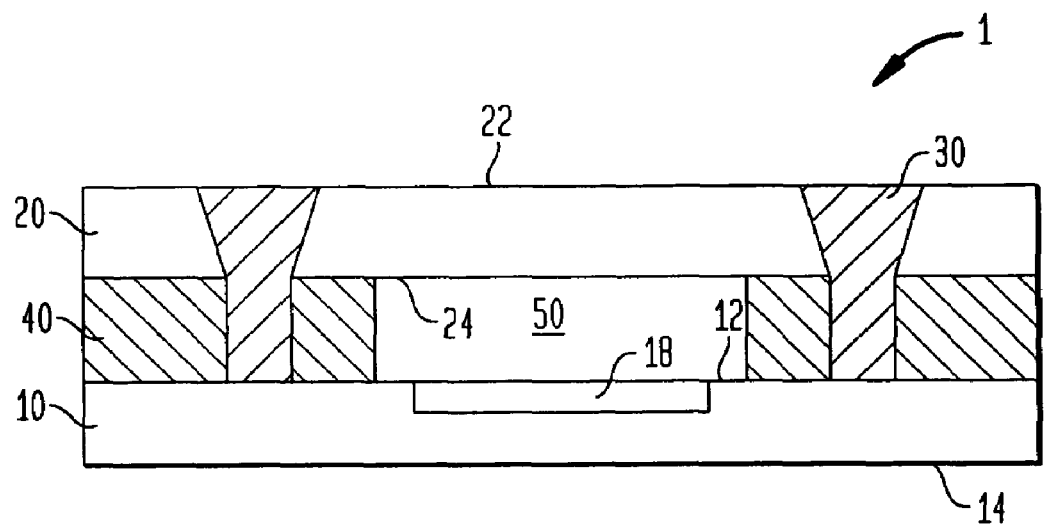
FIGS. 2A and 2B, collectively referred to as FIG. 2, schematically illustrate a wafer-level package similar to that depicted in FIG. 1, except that the picture frame seal ring both forms a cavity around the device and encompasses the interconnect structure.
Figure 2B:
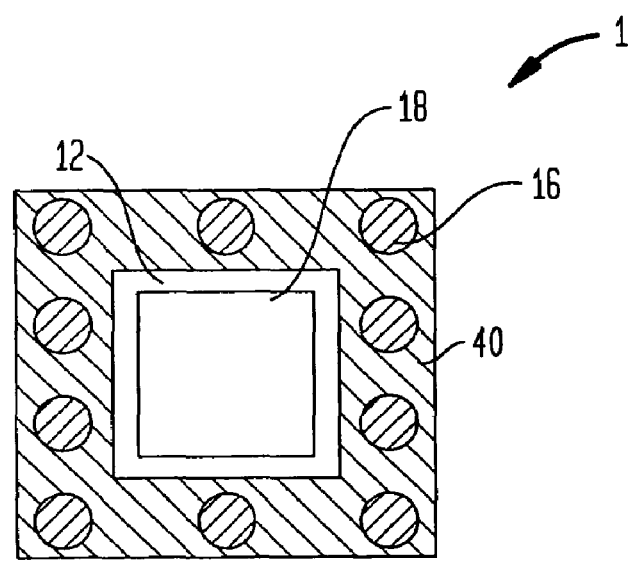

FIG. 2 depicts another example of a wafer-level cavity package which can be adapted to incorporate the invention in part or in whole s shown. The package 1 of FIG. 2 is similar to the package of FIG. 1 in that a microelectronic device 10 and a cover 20 are arranged in a similar alignment. In addition, like the package of FIG. 1, the package of FIG. 2 includes a cavity defined by cover surface 24, device surface 12, and picture frame seal 40. Unlike the package of FIG. 1, however, the seal 40 encompasses the interconnect structures 30. That is, instead of being circumscribed by the seal, the interconnect structures 30 are embedded or extends through the seal 40. To form the package depicted in or similar to that depicted FIG. 2, a passage must be provided for each interconnect structure 30 so that the interconnect structures 30 may extend their respective contacts 16 to their corresponding through holes 26. This may generally be achieved in two different ways. The seal 40 may be formed after the interconnect structures 30 are in place. However, it may be difficult to reliably place seal material after the interconnect structures are position.

Figure 3A:
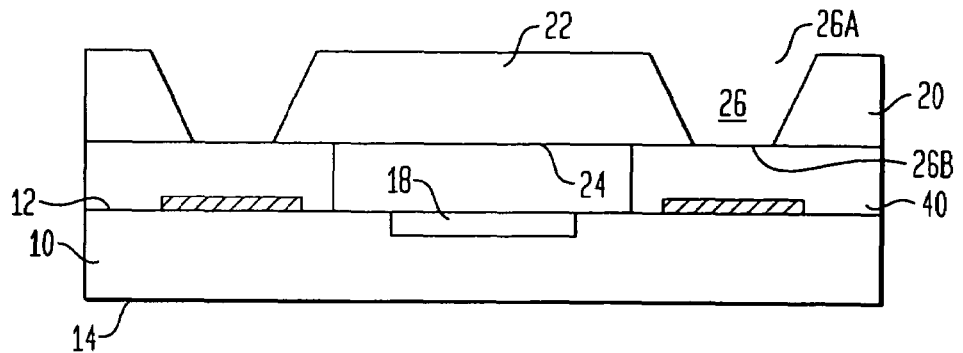
FIGS. 3A-3C, collectively referred to as FIG. 3, depict a process in which seal material is selectively applied to form a precursor to a wafer-level package similar to that depicted in FIG. 2.

Alternatively, the passages may be formed before the interconnect structures are sited. As shown in FIG. 3, seal material may be selectively applied to form a precursor to a wafer-level package. In FIG. 3A, a seal material is used to immobilize a cover 20 and a device 10 relative to each other such that the through holes 26 of the cover are aligned with the device contacts 16. As a result, a picture frame seal 40 is formed that defines cavity 50. The seal 40 is interposed between the through holes 26 of the cover 20 and the device contacts 16.

Figure 3B:
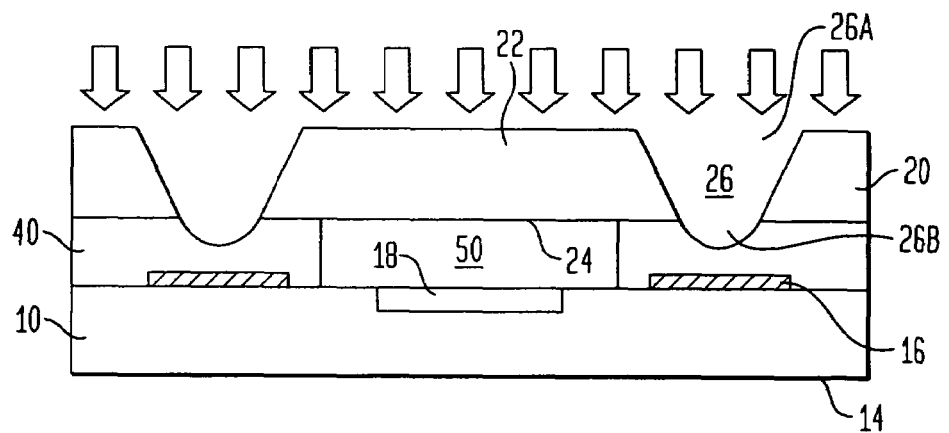
Figure 3C:
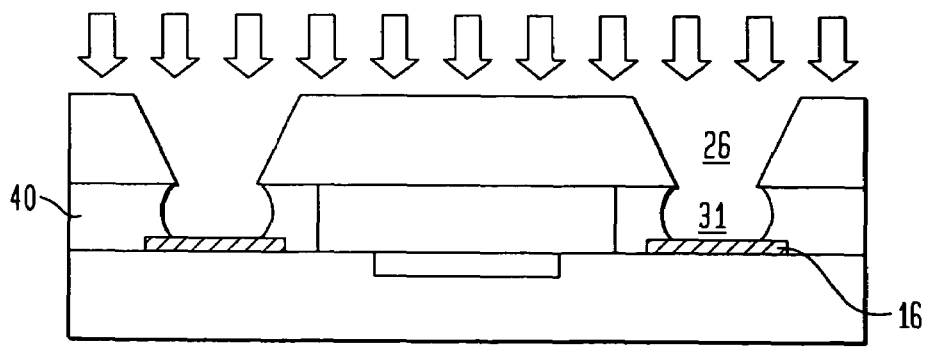

To provide electrical access to the device contacts from the first cover surface 22, a passage may be formed through seal 40. This may be achieved through any of a number of ways. For example, as depicted in FIG. 3B, an etchant is applied to through-holes 26 in the cover 20 to remove selective portions of the picture frame seal 40. In addition or as an alternative (not shown), a laser or mechanical forming method like drilling or punching may be used to remove portions of the picture frame seal without undercut in the vicinity of the interface between the cover and picture frame seal material. In any case, material is removed from the picture frame seal 40 in a pattern-wise manner corresponding to the size, shape and locations of the through holes 26. Once a sufficient amount of material is removed from seal 40, as shown in FIG. 3C, passages 31 are provided between the cover through-holes 26 and the now-exposed device contacts 16. As a result conductive interconnect structures may be placed within passages 31 for attachment the exposed to device contacts.

Through-holes, when present in the cover, may exhibit any of a number of geometries and/or shapes. When the invention provides a plurality of through-holes, they typically have the same shape and/or size. However, through-holes of different sizes and shapes may be used as well.

For example, as depicted in FIG. 3, each through-hole is of identical size and geometry. The first opening 26A of each through-hole 26 has a larger cross-sectional area than the corresponding second opening 26B. Thus, the sidewalls 28 of the through-holes 26 exhibit a taper profile. Exemplary tapered profiles may correspond to polyhedrons such as tetrahedrons, cones, and pyramids. In addition, the through-holes 26 may exhibit axial and/or mirror symmetry.

Figure 4:
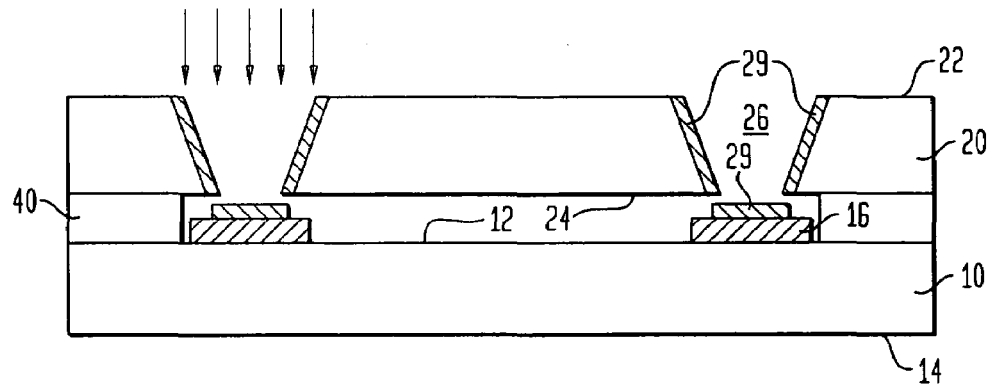
FIG. 4 depicts a deposition process in which a cover serves as an in situ shadow mask that allows for the simultaneous coating of contacts on a device wafer and the side walls of through-holes in a cover aligned with the contacts.

It is sometimes desirable to deposit a layer of material 29 on a sidewall 28 of a through-hole 26 and/or on a device contact 16. For example, as depicted in FIG. 4, a coating 29, e.g., solder wettable material that is optionally metallic, may be simultaneously deposited on the side wall 28 of through-holes 26 in the cover 20 and on the contacts of the device. In such a case, the cover 20 is used as an in situ shadow mask.

Thus, taper angles may be selected according to the requirements of the package. A shallow angle tends to allow the thickness of conductive coating on the side wall to increase at nearly the same rate as the thickness of the conductive coating on the second substrate surface. However, a shallow angle requires more substrate area. Thus, a taper angle of about 5° to about 60° may be used with the invention. In some instances, taper angle of about 20° to about 60° may be employed. A taper angle of 45° may be optimal for many applications.

Heat may be used in packaging technologies. In particular, wafer-level packages having a cover, device, and optionally interconnect structures extending from the device through the cover, e.g., the packages depicted in FIGS. 1-3, may be exposed to extreme thermal variations during and/or after formation on a local and/or global scale. Such thermal variations do no usually pose a problem when the cover expands and contracts at the same or a substantially similar rate as the device wafer in response to a thermal excursion. If, however, the cover and the device wafer differ in their coefficients of thermal expansion (CTE) and the cover and device are free to expand or contract in response to temperature changes, any feature of the cover and/or the device wafer may become misaligned when there is a change in temperature. In some instances, components of packages distort to form a hemispherical cup.

Such misalignment of a cover and a wafer having differing CTE undergoing a temperature excursion, but not substantially joined is shown in FIG. 11. In FIG. 11, an assembly is formed from a unitary cover 20 is positioned over a plurality of substantially identical devices 10A and 10B formed on a single wafer 10. Wafer surface 12 and cover surface 24 are substantially identical in size and shape. The cover 20 has a higher CTE than the wafer 10. Each device includes contacts 16 on its front surface 12, and the cover 20 includes a plurality of through-holes 26 that correspond spatially to the contacts 16. A plurality of interconnect structures 30 extend from each contact 16 through its corresponding cover though-hole.

Figure 11A:
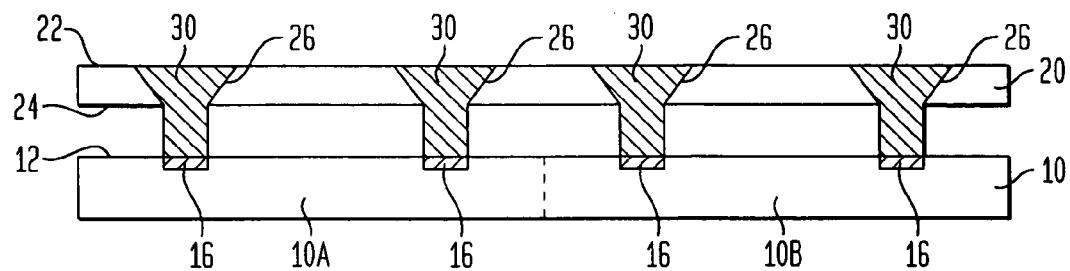
FIGS. 11A and 11B, collectively referred to as FIG. 11, schematically illustrate the effects of thermal excursions on a wafer-level assembly of packages formed from a cover and a wafer of differing coefficients of expansion.

In FIG. 11A, the assembly is maintained at a temperature that allows for cover and wafer feature alignment. As shown, each contact 16 is located directly under its corresponding cover through-hole 26. As a result, the interconnect structures 30 are generally parallel to each other and perpendicular to surfaces 12 and 24.

Figure 11B:
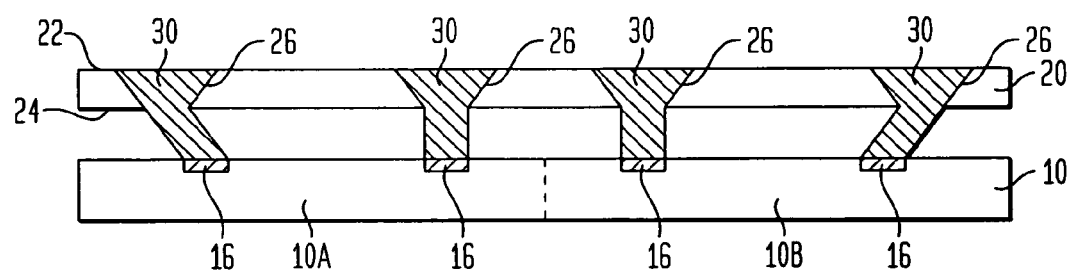

In FIG. 11B, however, the assembly is exposed to a higher temperature that allows both the cover 20 and the wafer 10 to expand. Since the cover 20 has a higher CTE than the wafer 10, the cover 20 expands to a greater degree than the wafer 10. As a result, the cover surface 24 is now larger than device surface 12. In addition, most device surface device contacts 16 and their corresponding cover though-holes 26 become misaligned and the interconnect structures 20 are no longer generally parallel to each other. Notably, the degree of misalignment is will be most severe at the edge of the wafer, because that is furthest in distance from the neutral point of the assembly, which is the centre of the device wafer. Accordingly, the device contact near the center of the wafer and its corresponding cover through-hole remain aligned.

Problems associated with CTE mismatch between the device and the cover tend to become exacerbated with an increase in device size. Similarly, in a wafer-level packaging context, CTE mismatch is significantly more problematic when compared CTE mismatch for packages formed from individual devices.

To overcome the problems associated with CTE mismatch as described above, one may employ devices and covers having closely matched CTE. With this approach, the CTE of the wafer and the substrate should be more closely matched as the size of the wafer increases. For example, many semiconductor-based devices such as MEMS are built on or in the near surface region of elemental semiconductors such as Si or compound semiconductors such as GaAs and other III-V compounds. These and other semiconductor materials generally have low CTE, typically on the order of 5 ppm/° C. or smaller. For semiconductor wafers having a diameter of at least 200 mm, the cover and the wafer may have CTE that differ by no more than about 0.2 ppm/° C. Optimally, the CTE for the wafer and the cover differ by no more than about 0.1 ppm/° C. For wafers having a diameter less than 200 mm, CTE differences of about 0.3 ppm/° C. may be acceptable. Ceramics having a CTE close to that of silicon is known in the art. Glasses having a CTE close to that of silicon are available from Corning Incorporated (Corning, N.Y.) and Schott North America, Inc. (Elmsford, N.Y.). It should be noted that the CTEs set forth in the application refers to measurements made at approximately 20° C. One of ordinary skill in the art will recognize that CTE of any material may change according with temperature.

It is sometimes difficult, however, to find cover materials that both exhibit a CTE that matches the device and other properties required to function in a manner consistent with the device. For example, when used to package an optical image sensor built on a silicon wafer substrate, a cover must be transparent to optical radiation at wavelengths keyed to the sensitivity of the sensor. This limits the choice of available cover materials to materials such as the very few types of optically transparent glass that are specially formulated to match the thermal expansivity of silicon.

Thus, among other aspects of the invention, an alternative is provided for packages that employ a cover having a CTE similar or identical to that of a device attached to the cover. In particular, it has been discovered that when a cover for such a package is selected such that its effective stiffness is small compared to that of the device, the response of the package to temperature changes is dominated by that of the device. As used herein, the term "effective stiffness" generally refer to the product am item's modulus and a controlling dimension. One of ordinary skill in the art of mechanics will recognize that the controlling dimension is generally keyed to the item's thickness and shape. For example, as the packages depicted in FIGS. 1-3 are formed from components having a simple geometry, the effective stiffness of each item is the product of the item and its thickness. In essence, physical displacement of the cover in response to a temperature change is physically restrained by the device wafer.

For example, a microelectronic package of the invention may include a microelectronic device substantially immobilized relative to a cover having an effective stiffness that is lower than of the effective device stiffness, e.g., by 80%. The response of the package to temperature changes will be further dominated by the device when the effective cover stiffness is no greater than about 10% of the effective device stiffness. In most instances, the contribution of the cover to the response of the package to temperature changes can be completely ignored when the effective cover stiffness is no greater than about 1% of the effective device stiffness. Alternatively, when there is a need to have the response of the package to temperature changes dominated by the cover, the cover may be selected to exhibit a higher effective device stiffness.

The invention is particularly useful when the CTE of the cover substantially differs to a significant degree from that of the device. In addition, the invention is particularly suited for packages that include a cover that has a higher CTE than the device, though covers having a lower CTE may benefit from the invention as well. For example, advantages of the invention are readily perceptible when the CTE of the device and the cover differ by at least about 0.5 ppm/° C. In addition, the advantages become even more evident when the cover CTE differs from the device CTE of the device by at least about 1 or 2 ppm/° C.

The microelectronic devices of the invention may take any of a number of forms, including, but not limited to, the form of a chip or a wafer. Chips and wafers are typically made from elemental semiconductors consisting essentially of Si, Ge or the like or from compound semiconductors such as GaAs and other III-V compounds. As discussed above, these and other semiconductor materials generally have low CTE, typically on the order of 5 ppm/° C. or smaller, and high moduli. Nevertheless, microelectronic devices may be made from other materials as well that changes the overall CTE and effective stiffness of the device.

While devices suitable for use with the invention typically have opposing front and rear surfaces, wherein the front surface provides electrical accessibility, microelectronic devices of any geometry may benefit from the invention. In addition, the invention may be used in conjunction with microelectronic devices used for any of a number of applications, including, for example, semiconductor processors, memory chips, MEMS, optical devices, and microfluidic devices. Furthermore, the device may be constructed to contain or exclude specific feature according to the intended use of the device. For example, when the device is not intended for optical applications, the device may contain no optically sensitive and/or emitting element.

In any case, the invention may be used to package an optical image sensors and/or emitter. High pixel count semiconductor sensors and/or emitters are often provided with an array of microlenses that focus the incident light on to the pixels and thereby improve the ability of the sensor to respond in low ambient light conditions. The microlenses require an air gap or cavity above them for proper operation, essentially to maximize the change in refractive index at the lens surface.

Typically, the electrical contacts on the front surface of the microelectronic are arranged in an ordered arrangement, i.e., an array such as rectilinear grids, parallel stripes, spirals, and the like. For example, some microelectronic device suitable for the invention may have a square front surface and/or a linear array of contacts, i.e., a plurality of colinear contacts having equidistant neighboring contacts, lying along a dotted line defined by center points of opposing edges of the device that bisects the front surface. As another example, a microelectronic device may be used having a rectangular front surface and a rectilinear array of contacts arranged on the front surface in parallel columns that exhibit mirror symmetry. As yet another example, contacts may be provided in a plurality of arrays, optionally in a manner such that they are substantially absent from a peripheral portion of the device surface.

As alluded to above, the cover should be made from a material selected according to the requirements of the package. Thus, the cover material must have a shape, size and properties appropriate for the proper functioning of the device. For example, optical image sensors typically require that the cover be optically transparent or translucent, in part or in whole, to electromagnetic radiation having a wavelength in the 400 nm to 700 nm range. Opaque covers may be used for non-optical purposes. Other factors may affect materials selection as well. For example, cost, availability and compatibility with desired processing practices and/or industrial infrastructure may be taken into consideration for materials selection.

Depending on the intended use of the package, the cover may comprise metallic, ceramic, semiconductor, and/or polymeric materials. In general, the terms "metallic," "ceramic, " "semiconductor" and "polymeric" are used herein in their ordinary sense. For example, the term "metallic" generally describes any of a category of electropositive elements that usually have a shiny surface, are generally good conductors of heat and electricity, and can be formed into thin sheets or wires. Exemplary metals suitable for use as a cover material include copper, aluminum, iron, nickel, alloys thereof, and of combinations of any of the foregoing.

Similarly, the term "semiconductor" is used to indicate any of various solid crystalline substances having electrical conductivity greater than insulators but less than good conductors. Exemplary semiconductors include elemental solids such as Si and Ge and compound semiconductors such as GaAs.

The term "ceramic" is used to indicate to a hard, brittle, heat-resistant and corrosion-resistant dielectric material made typically made by heating an inorganic compound, e.g., single or mixed metal oxides such as aluminum, zirconium or silicon oxides, nitrides, and carbides, at a high temperature. A ceramic material may be single crystalline, multicrystalline, or, as in the case of glass, amorphous.

The terms "polymer" or "polymeric" refer to any of numerous natural and synthetic compounds of usually high molecular weight formed from a plurality of monomeric units, each typically having a low molecular weight. The terms include, for example, homopolymers as well copolymers, linear as well as branch and/or cyclic polymers, crosslinked as well as uncrosslinked polymers.

In particular, polymeric materials may be advantageously used to form the cover of the invention. Many polymeric materials can be fabricated in thin sheets and have relatively low modulus compared to semiconductors. As a result, a broad choice of polymers are candidates for use as cover materials, particularly when one wishes to form a package having a cover and a semiconductor microelectronic device wherein the cover has a substantially lower effective stiffness than that of the device. Exemplary polymers suitable for use in the invention include those known in the microelectronic packaging industry such as those containing cyclic moieties, e.g., polycarbonates, polyimides, polyethylene terephthalates, and polystyrenes. In addition, polymer families such as polyarylene ethers, polyarylenes, and parylenes may be used as well. In some instances, halogenated polymers may be used. Exemplary commercially available fluorinated and/or chlorinated polymers include polyvinylchloride, polyvinylfluoride, polyvinylidene fluoride, polyvinylidene chloride, polychorotrifluoroethylene, polytetrafluoroethylene, polyhexafluoropropylene, and copolymers thereof.

Regardless of the particular composition of the cover, a particular class of material may be used to the entirety or a portion of the cover depending on the particular application. For example, the polymeric material may serve as bulk of the cover or be provided as a coating on the cover. In some instances, the cover may include a substantially water-vapor impermeable coating to slow or deter passage of water-vapor. Such coatings are typically comprised of an inorganic material, since inorganic materials generally have vastly superior performance in this regard than organic materials. Exemplary inorganic materials may be, for example, ceramic, semiconductor or metallic in nature. Similarly, an antireflective coating may be provided for certain optical applications. In some instances, the cover may include a liquid crystal material.

When the cover includes a coating, the coating may serve more than one function. For example if the cover is comprised of a fluorinated aromatic polyimide, which is optically transparent, the through transmission of light can be greatly improved when major surface of the cover coated with an anti-reflection coating of a material like silica ($SiO_2$). Silica has a much lower permeability to gasses and wafer vapor than fluorinated aromatic polyimide so even a thin layer will markedly decrease the rate of atmosphere exchange between ambient and the device cavity.

As discussed above, the inventive package may include a seal between the cover and the device. Any of a number of materials may be used to form the seal. For example, when the seal serves to immobilize the cover and the device relative to each other, adhesives such as those in the form of a curable mass, e.g., as a liquid or a gel, may be placed between the device and the cover and subjected curing conditions to form an adhesive polymer layer therebetween. Additional adhesives, e.g., pressure-sensitive adhesives or solvent containing adhesive solutions may be used as well.

Thus, the invention also provides a method for forming an array of wafer-level packages by applying a seal material to the perimeter of each device and then attaching a cover wafer to the devices. It is not necessary to prevent the seal material from covering the contacts because the seal material is removed to expose the contacts during subsequent processing, although the seal material may be removed from these areas prior to attachment of the cover, if desired. As a result, the seal can generally be made wider. A wider seal may improve the mechanical robustness and leak tightness of the packages. Additional benefits associated with such a technique include higher yields and lower implement costs because the technique is more forgiving with respect to the precision needed for the application of the seal material.

As depicted in FIGS. 1-4, packages of the invention may be formed by providing a cover having through-holes formed therein before the cover is immobilized relative to the device. However, the invention also allows for the formation of cover through-holes after a cover and device are immobilized relative to each other. As discussed below, formation of through-holes in the cover provides a number of advantages such as reducing materials and process costs associated with wafer-level packages having vertical interconnect structures.

In another aspect, the invention provides a method for forming a microelectronic package that involves substantially immobilizing a microelectronic device as described above and a cover having opposing surfaces relative to each other such that a cavity is defined therebetween. Material is selectively removed from at least the cover so as to form through-holes that are aligned with the electrical contacts of the device.

Figure 5:
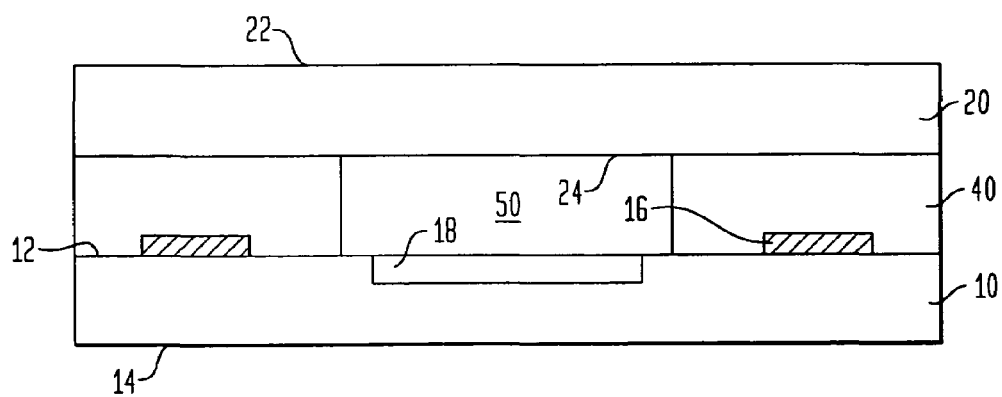
FIG. 5 depicts in cross-sectional view a wafer-level cavity package formed using a solid sheet of material as for the package cover.

Unlike other methods for forming microelectronic packages, the cover may be initially featureless, e.g., without through-holes when it and the device are immobilized relative to each other. Such a precursor package, depicted in FIG. 5, is similar to the package depicted in FIG. 3A except that the cover 20 may initially consist of or consist essentially of a solid sheet of material. By using a cover 20 that includes few or no features, the cost and yield for such packages may be improved because no alignment is needed between cover features with device features, e.g., cover through-holes with electrical contacts on the front device surface.

Figure 6:
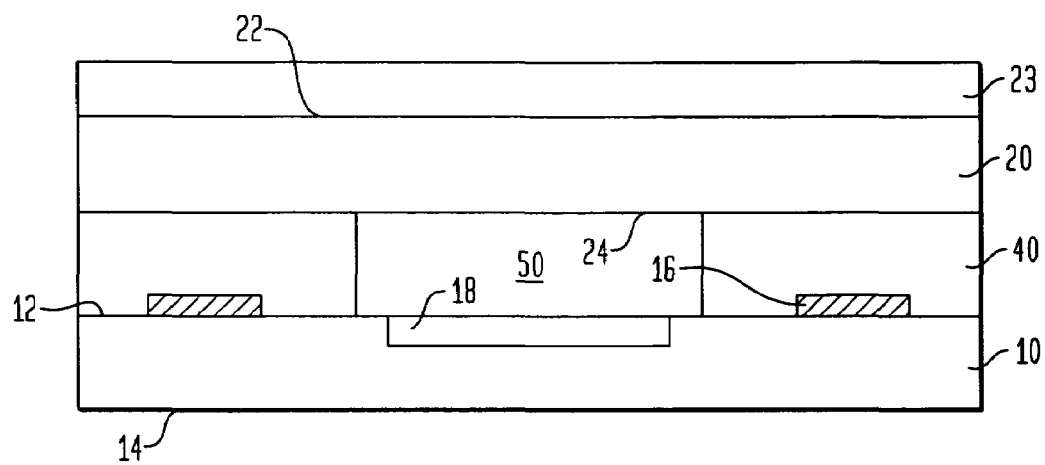
FIG. 6 depicts in cross-sectional view a wafer-level cavity package that has sacrificial layer applied as a coating to the front face of the cover material.

For certain embodiments of the invention, the exterior surface 22 of the cover 20 may be coated with a layer of a sacrificial material. For example, the precursor package of FIG. 5 may be so coated with a sacrificial layer 23 to form the package of FIG. 6. The sacrificial layer may be applied to the cover before, during, or after the immobilization of the cover and the device, and may be used to facilitate further later processing.

Any of a number of materials may be used to form the sacrificial layer. Preferably, the sacrificial material has good adhesion to the cover but is readily removable at a subsequent process step. Photoresist is one example of a potentially suitable chemical for the sacrificial layer. However, photoresist often requires an organic solvent for removal. Should photoresist be used, the photoresist should be of a composition that is removable by a solvent that is compatible with the cover and other components of the package. For example, the solvent should not alter or degrade any polymeric materials, e.g., including those used for the cover and/or the seal. Accordingly, in some instances, water-soluble sacrificial materials such as polyvinyl alcohol, polyethylene oxide, and cellulosic materials may be preferred. The sacrificial coating may be a reusable member, such as a shadow mask comprising a molybdenum or stainless steel foil, temporarily attached to the cover by means of clips, adhesive film, or a layer of stick material When initially a featureless cover is used, through-holes may be formed to provide access to device contacts. For example, to provide electrical access to the device contacts, interconnect structures of the invention may first require that through-holes be formed through a cover by selectively removing material therefrom. When a seal material is also provided over the device contacts, materials may be selectively removed from the seal as well to expose each device contact. By removing material from the cover and the seal after the cover and seal are in place, there is no need to: apply the picture frame seal material carefully around each contact; independently create in the lid material a pattern of through holes that exactly register with the contacts on the device wafer; and align the pattern of through holes in the lid wafer with the device contacts when the package is assembled. Accordingly, the use of a technique that involves selective material removal from the cover and/or the seal provides considerable economic and process benefits as compared with alterative techniques.

Selective material removal may be carried out in any of a number of ways. For example, an etchant may be selectively applied to the exterior surface of the cover to form a through-hole. However, careful selection of etch compositions and/or parameters may be required to reduce uncontrolled materials removal phenomena, e.g., undercutting, that may accompany etching processes.

In addition or in the alternative, laser-based techniques may be used to pattern and/or drill the cover and/or seal. When laser ablation technique is used, the laser must be selected according to the material to be removed. For example, the energy required to vaporize glass is typically five to ten times higher than that required for organic materials. In addition, a metallic or other highly reflective material having a high melting point and/or enthalpy of vaporization relative to the cover and/or seal, e.g., aluminium or gold, may be provided on the device contacts to act as a drill stop. A modern laser drill can be programmed to identify particular locations on the device wafer, such as alignment marks and drill a pattern of holes based on offsets from these data. Because of the physical precision with which device wafers are made and laser position systems, the end result is that each through-hole will be positioned precisely above each contact it is desired to connect.

Figure 7:
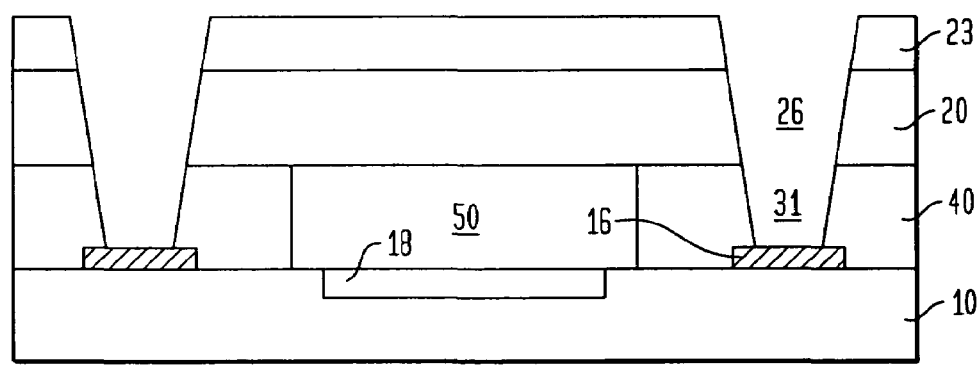
FIG. 7 depicts in cross-sectional view a package similar to that depicted in FIG. 6 except having through-holes formed to expose the contacts of the device.

As discussed above, through-holes in the cover may be tapered. The taper profile may continue through the seal to provide access to the device contacts. A defocused laser beam may be used to drill through the cover and/or the seal to result in a passage that exhibits a taper profile. For example, as shown in FIG. 7, the passages 31 formed using a laser exhibit an uninterrupted sidewall profile through the sacrificial layer 23, the cover 20, and the seal 40. This in contrast to the passage 31 formed using an etchant, as shown in FIG. 3C, in which the etchant removes material from the seal 40 in a manner that undercuts the cover through-holes 26. As discussed below, an uninterrupted sidewall profile is preferred over a profile that exhibits undercutting of the seal by the etchant.

Regardless how through-holes in the cover and/or the seal is formed, an interconnect structure may be placed in the through-hole to provide an electrical passage from the device contact to the exterior cover surface. For example, the through holes can be filled with a conductive organic material and/or with metal after the side walls have been coated with a wettable material such as a metal. Metallization of the side walls and contacts on the device is necessary as metals will not normally wet and adhere to organic materials and the preferred metal for filling of the through holes, solder, will not wet to the aluminium of the contacts.

Metallization of the sidewalls of the through holes can be achieved by any of a number of techniques including, for example, a vapor-phase deposition process such as sputtering or evaporation, or a liquid-phase deposition process such as electroplating. Electroplating is particularly suited for packages that include a picture frame seal around each through-hole that prevents ingress of material into the device cavity.

Figure 8A:
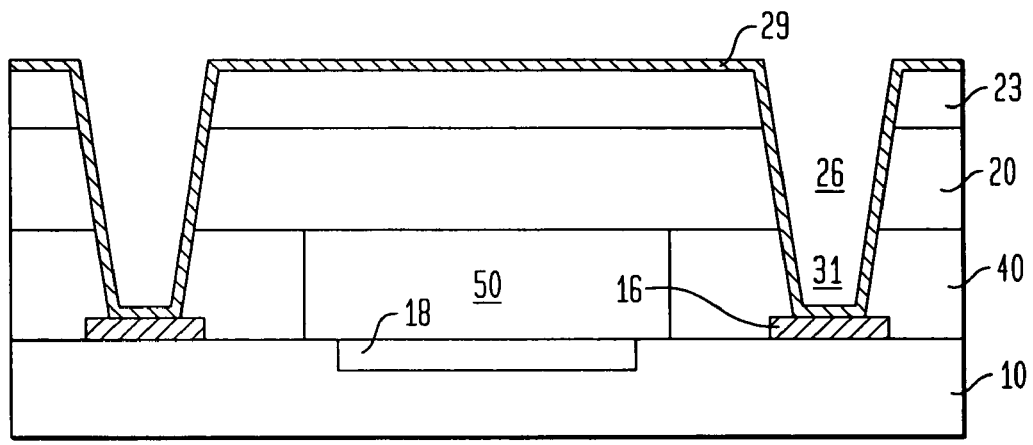
FIGS. 8A and 8B, collectively referred to as FIG. 8, depict a metallization process for sidewalls of the through-holes of the package depicted in FIG. 7.
Figure 8B:
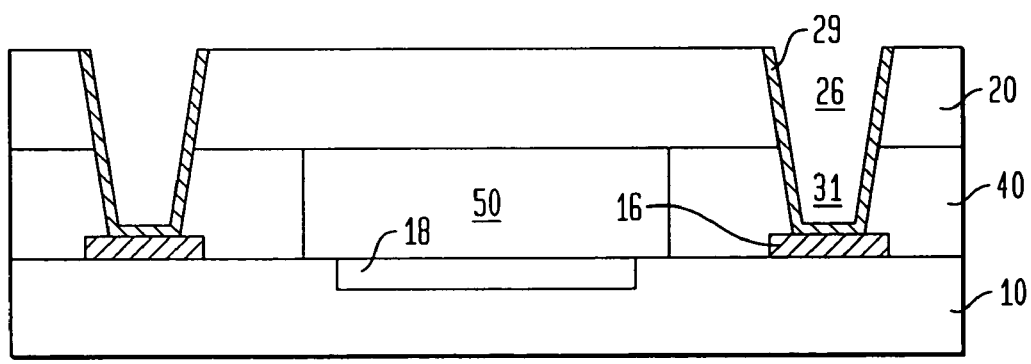

As discussed above, a sacrificial layer may be applied to the exterior surface of the cover. In some instances, the sacrificial layer permits simplification of the metallization processes. As discussed above and shown in FIG. 4, for example, a coating may be simultaneously deposited on the side wall of the through-holes 26 in the cover 20 and the contacts 16 of the device, wherein the cover 20 serves as an in situ shadow mask. When a sacrificial layer 23 as shown in FIG. 8A is provided, the sacrificial layer 23 may function as a stencil to protect the regions of the exterior cover surface from metallization. As a result, metal 29 is deposited on the sacrificial layer 23 as well as the sidewalls of the passage to the device contacts and the device contacts themselves. In FIG. 8B, the sacrificial layer 23 is removed, leaving metallization solely in the desired locations. Thus, it is evident that the sacrificial layer simplifies the metallization process by eliminating the need for equipment that requires alignment to the through-holes. As mentioned earlier, the sacrificial layer may be shadow mask, reusable or otherwise.

Once the sidewalls of passage 31 to the device are metallized, solder or another conductive material can be used to fill the passage to form interconnect structures 30. Solder suitable for use with the invention may take any of a number of forms. Typically, balls or spheres are used. Pastes and other forms of solder may used as well. Regardless of the form of solder used, any various fusible alloys may be used. For example, eutectic solders containing tin and/or lead are known in the art.

When the passage extends through a seal that forms a barrier to a package cavity between the cover and the device, a flux may be advantageously used in conjunction with solder, since fluxless solder flow processes tend to be more costly. The flux may be present in the solder or in the passage. Optionally, a solder resist, typically an organic material, may be used to mask areas adjacent to the regions on which the solder may contact.

In any case, it should be apparent that for packages that include a seal circumscribing a cavity between the cover and the device, electrically conductive interconnect structures may each extend from an electrical contact and through the hole aligned with the contact. The some or all of the interconnect structures may be located within the cavity and/or outside the cavity. Optionally, some or all or the structures may be encompassed by the seal.

The invention is suitable for use in sealed package application. A potential issue arising from the use of a cover having a low effective stiffness for a sealed package is that the cover may bow in response to a pressure differential between the interior and the exterior of the package. Thus, it is sometimes preferable to seal the package at a pressure that the device is projected experience during testing, storage, and/or use to minimize cover deflection. Typically, the package is sealed within a pressure range or at the average pressure that the device is projected to experience. For example, testing and storage tests may be carried out at a pressure of 0 to about 2 atmospheres. More typically, such tests may be carried out at a pressure of 0.5 to 1.5 atmospheres, with an average of about 1 atmosphere. In addition, since pressure generally varies proportionally to temperature, the package may be sealed within a temperature range or at the average temperature that the device is projected to experience. For example, typical testing temperature ranges for package testing may span from about −40° C. to about 125° C.

In some embodiments, a package is provided that provides functionalities associated with ground planes and/or electromagnetic shield. In such a case, an electrically conductive layer or coating may be provided. Electrically conductive layers and/or coatings may be comprised of one or more electrically conductive material. Typically, such layers and/or coatings are made from one or more metals. For example, a conductive layer may be comprised of solid copper or a composite composition containing copper particles. Additional metals suitable for use in the invention include, for example, gold, silver, nickel, tin, chromium, iron, aluminum, zinc, titanium, platinum, combinations thereof, and alloys of any of the foregoing such as brass, bronze, and steel. Magnetic metals and alloys, e.g., those containing cobalt, may be used as well to effect screening functions. In some instances, a surface layer may be provided over a base conductive layer of the electrically conductive regions, wherein the surface and base layers have differing compositions. For example, a highly conductive coating such as gold, gold/nickel, gold/osmium or gold/palladium, may be coated on a less conductive material.

In addition or in the alternative, a base layer may be plated with a wear resistant coating such as osmium, chromium or titanium nitride.

Figure 9A:
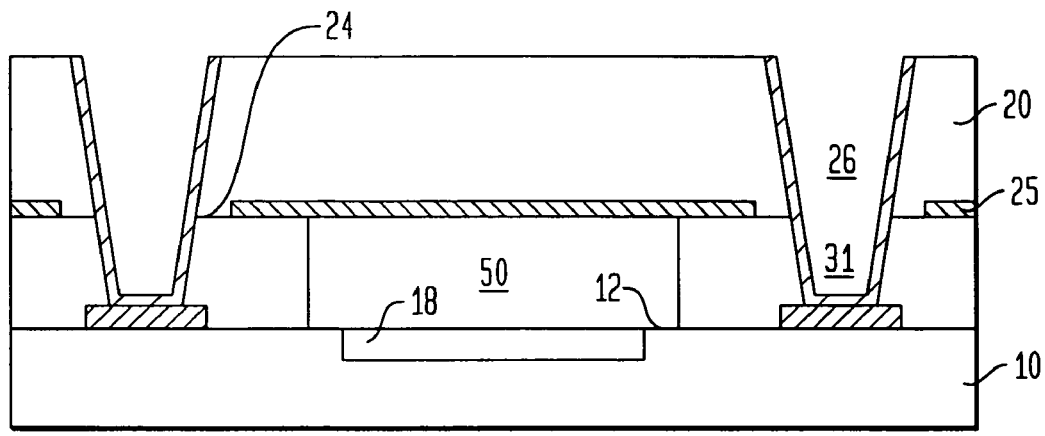
FIGS. 9A and 9B, collectively referred to as FIG. 9, depict in cross-sectional and plan view, respectively, a wafer-level cavity package formed using commercially available flexible circuit material for the wafer lid, wherein a copper layer within the flexible circuit material is patterned to have an opening around each through hole so to avoid shorting of the interconnects.
Figure 9B:
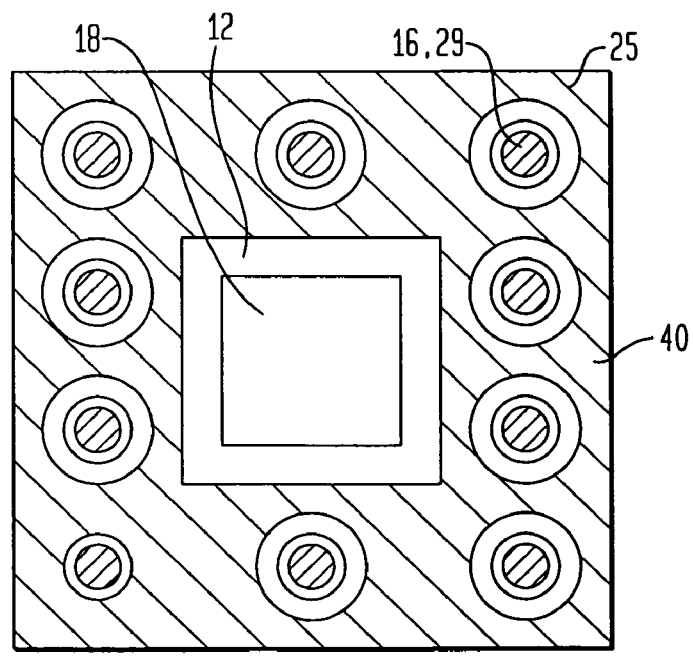

FIG. 9 depicts a package similar to that depicted in FIG. 8B except that it includes a ground plane 25 on an interior surface 24 of the cover 20. The package of FIG. 9 may be formed using commercially available flexible circuit material for the cover. For example, the cover in combination of the ground plane may be formed from a tape comprising a layer of polyimide or liquid crystal polymer, typically having a thickness of about 50 µm, to which a layer of copper, typically having a thickness of about 15 µm, is attached. The copper layer may be patterned to have an opening around each through hole so to avoid shorting of the interconnect structures. The copper layer may also be patterned to from a wiring trace or another form of an electrically conductive pathway. In some instances, the cover may be inverted so that the ground plane is on an outer surface.

Figure 10A:
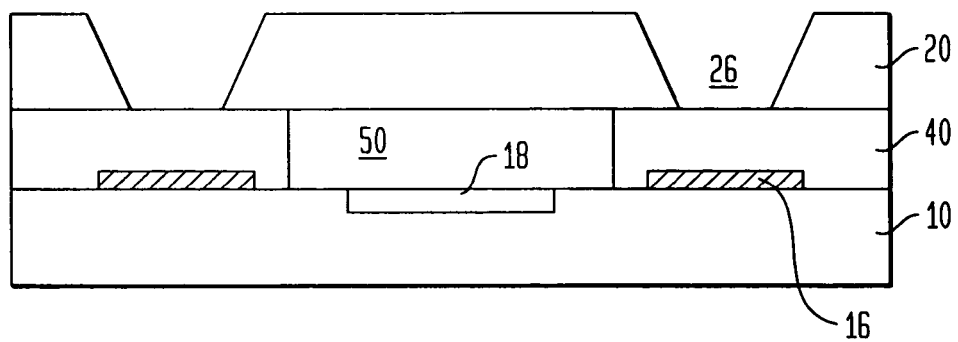
FIGS. 10A-10C, collective referred to as FIG. 10, depict a simplified assembly process for a wafer-level cavity package having vertical interconnects and a cover containing preformed through-holes.
Figure 10B:
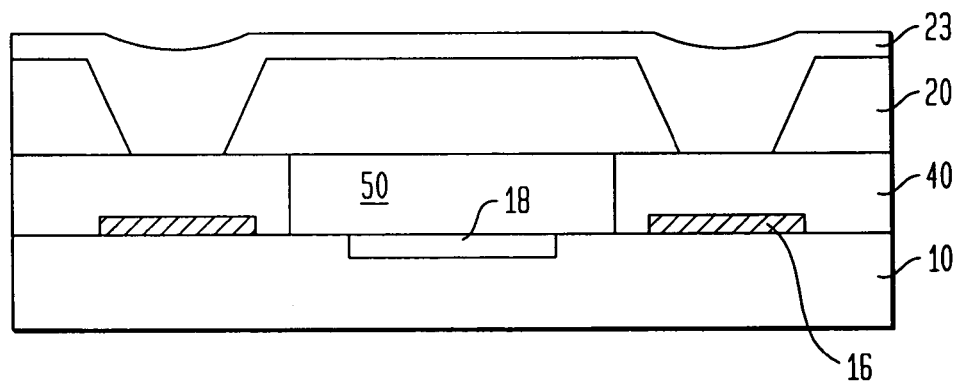
Figure 10C:
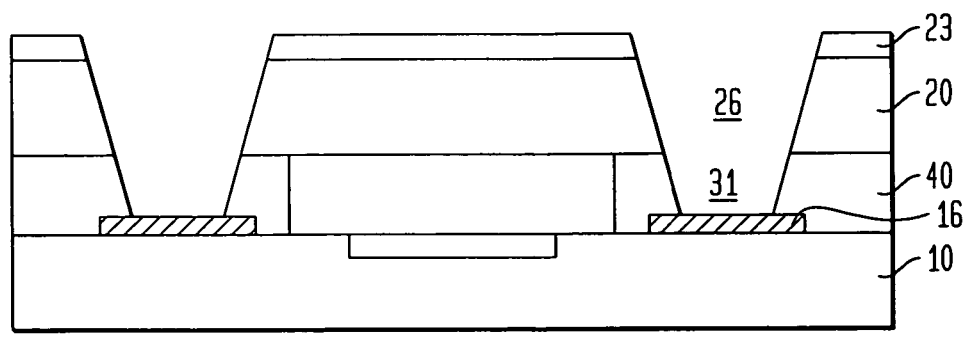

The ability of a laser to provide differential etching between glass and organic materials can be exploited to simplify the fabrication process for a package that uses a glass cover containing preformed tapered through holes. For example, as depicted in FIG. 10A, a cover 20 may be attached to the device 10 using the picture frame seal material 40. Then, as shown in FIG. 10B, the sacrificial layer 23 may be applied to the exterior surface 22 of the cover in a manner that will by default either or partially fill the through-holes 26 in the cover 20. By using a suitably focussed or steered laser beam, the sacrificial layer material can be removed from the through-hole 26 in the manner depicted in FIG. 10C to form a passage 31 that exposes the device contacts 16. The resulting structure is then identical to that achieved in FIG. 7, but accomplished with fewer process steps.

Any of the packages described herein may be formed using a wafer-level process or method. In general, a unitary wafer may be provided comprising a plurality of microelectronic devices. Typically, the devices are arranged in an array and have coplanar front surfaces with a plurality of electrical contacts thereon. A unitary cover may be placed over the unitary wafer to form an assembly of attached packages. Once completed, the assembly may be diced to form individual microelectronic packages.

Thus, the invention provides previously unknown advantages in the art of microelectronic packaging. In general, the invention allows for a greater variety of materials to be used in the packaging of microelectronic devices. This, in turn, provides potential savings in materials costs. In addition, certain processes associated with the inventive packages may be performed during wafer fabrication, e.g., sputtering and through-hole formation. Furthermore, certain alignment challenges between the cover through holes and the contacts are obviated by the inventive method.

Variations of the present invention will be apparent to those of ordinary skill in the art in view of the disclosure contained herein. For example, while the covers have generally been depicted herein as formed from a single piece, a plurality of pieces may be joined to form a unitary cover as well. Furthermore, an alignment mechanism may be provided for aligning the components the packages of the invention, e.g., the cover, the microelectronic device, etc. In general, aligning mechanisms or apparatuses known in the art, e.g., mating features, clips, clamps, guides (mechanical, optical, electronic, or magnetic), devices used in metrology, etc., may be used to facilitate proper positioning of the elements of the invention. Optionally, a locking mechanism may be used as well. The locking mechanism may be the same as or different from the aligning mechanism. Additional variations of the invention may be discovered upon routine experimentation without departing from the spirit of the present invention.

It is to be understood that, while the invention has been described in conjunction with the preferred specific embodiments thereof, the foregoing description merely illustrate and not limit the scope of the invention. Numerous alternatives and equivalents exist which do not depart from the invention set forth above. For example, any particular embodiment of the invention, e.g., those depicted in any drawing herein, may be modified to include or exclude features of other embodiments. Other aspects, advantages, and modifications within the scope of the invention will be apparent to those skilled in the art to which the invention pertains.

All patents and patent applications mentioned herein are hereby incorporated by reference in their entireties to the extent not inconsistent with the description set forth above.

The invention claimed is:

1. A microelectronic package, comprising:
a microelectronic device having
a front surface,
a plurality of electrical contacts on the front surface,
a coefficient of thermal expansion, and
an effective device stiffness;
a cover having
first and second opposing surfaces,
a plurality of through holes each extending from a first opening on the first surface to a second opening on the second surface,
a coefficient of thermal expansion that differs from the coefficient of thermal expansion of the device by at least about 0.5 ppm/° C. at about 20° C., and
an effective cover stiffness that is no greater than 20% of the effective device stiffness; and
a cavity located between the device and the cover,
wherein the cover and the device are substantially immobilized relative to each other such that the second cover surface faces the front device surface and the through holes are aligned with the electrical contacts.

2. The package of claim 1, wherein the cover coefficient of thermal expansion differs from the device coefficient of thermal expansion of the device by at least about 1 ppm/° C.

3. The package of claim 2, wherein the cover coefficient of thermal expansion differs from the device coefficient of thermal expansion of the device by at least about 2 ppm/° C.

4. The package of claim 1, wherein the effective cover stiffness is no greater than about 10% of the effective device stiffness.

5. The package of claim 4, wherein the effective cover stiffness is no greater than about 1% of the effective device stiffness.

6. The package of claim 1, wherein the cover comprises of a polymeric material.

7. The package of claim 1, wherein the polymeric material is fluorinated.

8. The package of claim 1, wherein the polymeric material is a polyimide.

9. The package of claim 6, wherein the microelectronic device comprises an optical sensor and/or emitter.

10. The package of claim 6, wherein the cover further comprises a ceramic material.

11. The package of claim 10, wherein the ceramic material is at least partially amorphous.

12. The package of claim 6, wherein the cover further comprises a substantially water-vapor impermeable coating.

13. The package of claim 6, wherein the cover further comprises an antireflective coating.

14. The package of claim 1, wherein the cover further comprises a liquid crystal material.

15. The package of claim 1, wherein the cover further comprises a metallic material.

16. The package of claim 1, wherein the first opening has a larger cross-sectional area than the second opening.

17. The package of claim 1, further comprising a seal circumscribing the cavity.

18. The package of claim 17, further comprising a plurality of electrically conductive interconnect structures each extending from an electrical contact and through the hole aligned with the contact.

19. The package of claim 18, wherein the interconnect structures are located within the cavity.

20. The package of claim 18, wherein the interconnect structures are encompassed by the seal.

21. A wafer-level package assembly comprising a plurality of packages of claim 1, wherein the devices are provided as a unitary wafer.

22. A wafer-level package assembly comprising a plurality of packages of claim 1, wherein the covers are provided as a unitary item.

23. An in-process element for a microelectronic package, comprising:
 a microelectronic device having an opto-electronic element, the microelectronic device having a front surface and a plurality of electrical contacts said front surface;
 a cover substantantially immobilized relative to the microelectronic device, the cover having a first surface facing away from a front surface and a second surface confronting the front surface;
 a protective barrier overlying a portion of the first surface of the cover vertically aligned with the opto-electronic element; and
 a cavity located between the microelectronic device and the cover, wherein the protective barrier is removable after the cover is immobilized relative to the microelectronic device.

24. The element of claim 23, wherein the protective barrier is thinner than the cover.

25. The element of claim 23, wherein the protective barrier is on the first cover surface.

26. The element of claim 23, wherein the protective barrier is soluble in a solvent.

27. The element of claim 26, wherein the solvent comprises water.

28. An in-process element for a microelectronic package, comprising:
 a microelectronic device having an opto-electronic element, the microelectronic device having a front surface and a plurality of electrical contacts thereon;
 a cover substantially immobilized relative to the microelectronic device, the cover having a first surface facing away from the front surface and a second surface confronting the front surface, and a plurality of through holes each extending from a first opening on the first surface to a second opening on the second surface;
 a protective barrier overlying a portion of the first surface of the cover vertically aligned with the opto-electronic element;
 a cavity located between the microelectronic device and the cover; and
 an organic material within at least one of the through holes, wherein at least some of the through holes are aligned with the electrical contacts; and
 wherein the protective barrier is removable after the cover is immobilized relative to the microelectronic device.

29. The element of claim 28, futher comprising the organic material on the first cover surface.

30. The element of claim 23, wherein a plurality of through holes extend through the protective barrier and the cover, the through holes aligned with the electrical contacts.

31. The element of claim 30, further comprising a conductive layer extending from the electrical contacts along the walls of the through holes and overlying an outer surface of the protective barrier.

32. The element of claim 31, wherein the portion of the conductive layer extending beyond the first surface of the cover is removable with the protective barrier.

* * * * *

UNITED STATES PATENT AND TRADEMARK OFFICE
CERTIFICATE OF CORRECTION

PATENT NO. : 7,485,956 B2
APPLICATION NO. : 11/204680
DATED : February 3, 2009
INVENTOR(S) : David B. Tuckerman and Giles Humpston It is certified that error appears in the above-identified patent and that said Letters Patent is hereby corrected as shown below:

Column 1, line 49, "device" should read --devices--.
Column 1, line 56, "then severed" should read --then be severed--.
Column 2, line 32, "is" should read --are--.
Column 3, line 10, "lower that" should read --lower than that--.
Column 3, line 28, "coating" should read --coatings--.
Column 3, line 61, "approximates" should read --approximate--.
Column 4, line 32, "has sacrificial" should read --has a sacrificial--.
Column 4, lines 40-41, "mmetal-lization" should read --metallization--.
Column 4, line 51, "collective" should read --collectively--.
Column 4, line 56, "layer applied" should read --layer is applied--.
Column 5, line 42, "immobilized," should read --immobilized--.
Column 5, line 53, "involve" should read --involving--.
Column 6, line 11, "A electrically" should read --An electrically--.
Column 6, line 21, "whole s" should read --whole as--.
Column 6, line 29, "extends" should read --extend--.
Column 6, line 38, "position" should read --positioned--.
Column 6, line 65, "the exposed to" should read --to the exposed--.
Column 7, line 26, after "instances," insert --a--.
Column 7, line 48, after "20" delete "is".
Column 8, line 5, after "alignment" delete "is".
Column 8, line 14, "compared CTE" should read --compared with CTE--.
Column 8, line 29, "differ" should read --differs--.
Column 8, line 32, "is known" should read --are known--.
Column 8, line 36, "refers" should read --refer--.
Column 8, line 58, "refer" should read --refers--.
Column 8, line 59, "the product am" should read --the product an--.
Column 9, line 4, after "than" delete "of".
Column 9, line 47, "feature" should read --features--.
Column 9, line 52, "sensors" should read --sensor--.
Column 11, line 23, after "when major" should read --when the major--.
Column 11, line 23, "cover coated" should read --cover is coated--.
Column 11, line 35, "subjected curing" should read --subjected to curing--.
Column 14, line 9, "may used" should read --may be used--.
Column 14, line 25, delete "The some" and insert --Some--.
Column 15, line 59, after "components" insert --and--.
Column 16, line 5, "description" should read --descriptions--.

CERTIFICATE OF CORRECTION (continued)
U.S. Pat. No. 7,485,956 B2

Column 16, line 52, after "comprises" delete "of".
Column 17, line 27, "contacts said" should read --contacts at said--.

Signed and Sealed this

Twenty-third Day of March, 2010

David J. Kappos
*Director of the United States Patent and Trademark Office*